United States Patent [19]

Feher

[11] 4,350,879

[45] Sep. 21, 1982

[54] TIME JITTER DETERMINING APPARATUS

[75] Inventor: Kamilo Feher, Ottawa, Canada

[73] Assignee: Canadian Patents & Dev. Limited, Ontario, Canada

[21] Appl. No.: 89,585

[22] Filed: Oct. 29, 1979

[51] Int. Cl.³ ............................................. G06M 3/08
[52] U.S. Cl. ........................ 235/92 EC; 235/92 SH; 328/163; 360/51
[58] Field of Search ......... 235/92 PB, 92 EC, 92 CA, 235/92 MT, 92 PL, 92 T, 92 SH; 328/163, 162; 324/83 D; 371/68; 360/51

[56] References Cited

U.S. PATENT DOCUMENTS

| | | | |
|---|---|---|---|
| 3,382,492 | 5/1968 | Santana | 360/51 |
| 3,395,399 | 7/1968 | Goodenow | 360/51 |
| 3,548,175 | 12/1970 | Tomlin | 235/92 EC |
| 3,643,170 | 2/1972 | Stanger | 328/163 |
| 3,711,773 | 1/1973 | Hekimian et al. | 324/83 R |
| 3,725,796 | 4/1973 | Schenk et al. | 328/163 |
| 3,895,186 | 7/1975 | Yoshida et al. | 178/69.5 F |
| 3,916,307 | 10/1975 | Hekimian | 324/83 R |
| 3,938,182 | 2/1976 | McKenna | 360/51 |
| 3,947,673 | 3/1976 | Jordan et al. | 235/92 SH |

OTHER PUBLICATIONS

"Single RC Network Gives Variable Delay, Preserves Input-Signal Pulse Width", Electronic Design, Jan. 4, 1979, p. 168.

*Primary Examiner*—Joseph M. Thesz
*Attorney, Agent, or Firm*—Edward Rymek

[57] ABSTRACT

The jitter determining apparatus uses only a jittery clock signal of period $T_b$ recovered from the received data signal to determine peak to peak jitter $J_{pp}$ and jitter distribution. The apparatus includes an AND gate having a pair of inputs. The inputs are coupled to a first signal which is the jittery clock signal delayed by a fixed amount $nT_b$ where n is preferably greater than 5, and to a second signal which is a jittery pulse signal generated from the jittery clock signal. The second signal is also controllably delayed by a factor greater than twice the jitter $J_{pp}$. The AND gate produces output pulses when coincidence occurs between the two signals as the delay of the second signal is selectively varied. A counter counts the pulses for each selected delay position and thus provides the peak to peak time jitter $J_{pp}$ of the clock signal.

14 Claims, 5 Drawing Figures

TIME JITTER DETERMINING APPARATUS

BACKGROUND OF THE INVENTION

This invention is directed to apparatus for measuring time jitter produced by data transmission systems and in particular to apparatus for measuring jitter in a system during transmission.

Time or phase jitter measurement techniques have been used for many years. These methods, which require the use of a jitter free reference clock, are particularly convenient for laboratory measurements and factory acceptance testing, but are not appropriate for field measurements where the distance between consecutive sections prohibits the economic realization of a separate carrier for the jitter free reference clock. Examples of jitter measurement apparatus using a jitter free reference clock are described in U.S. Pat. No. 3,711,773 which issued on Jan. 16, 1973 to Hekimian et al, U.S. Pat. No. 3,895,186 which issued on July 15, 1975 to Yoshida et al, and U.S. Pat. No. 3,916,307 which issued on Oct. 28, 1975 to Hekimian. It has been found however, that it is difficult to build a jitter free reference, which for accurate, reliable measurement purposes should have a jitter which is about 10 times smaller than the clock jitter to be measured. This difficulty has been found to be especially true for high speed systems having a transmission rate of 90 Mb/sec or higher rates. The need for in-service time jitter determining apparatus is especially felt in digital microwave, digital cable, satellite and regenerative optical fiber link systems particularly of the multi-hop type. In these systems, field troubleshooting is very expensive since, after installation, it is possible that equipment misalignment, temperature variations, humidity, any type of noise or interference, aging of components or any of a number of other causes may be such that the end-to-end system jitter becomes excessive. Jitter might also become excessive only during certain parts of a day while at other times it may not noticeably degrade the overall system.

SUMMARY OF THE INVENTION

It is therefore an object of this invention to provide a time jitter determining apparatus which does not require a jitter-free reference source.

It is a further object of this invention to provide time jitter determining apparatus which may be incorporated at the receive-end of a system as well as at repeaters in a system.

These and other objects are achieved in an apparatus that utilizes only the recovered jittery clock signal of period $T_b$ to determine the time jitter of the clock signal. The clock is applied to first and second signal paths, wherein the signals are delayed relative to one another by a variable delay factor. A logic circuit is coupled to the signal paths to receive the two signals and to indicate the coincidence rate of the signals as the delay is varied.

The signal delay includes a fixed delay line which has a delay factor $nT_b$ and which is positioned in one of the signal paths, and a variable delay line which has a variable delay factor and which is positioned in the same or the other signal path.

For the fixed delay line, n is preferably in the order of or greater than 5, and for the variable delay line, the delay factor varies over a period greater than $2J_{pp}$ where $J_{pp}$ is the peak to peak time jitter of the recovered clock signal.

The jitter apparatus may further include a pulse generator for converting the clock signal in the variable delay line path, into a signal consisting of a train of narrow pulses, and a control circuit coupled to the variable delay line for sequentially incrementing the delay. The logic circuit includes an AND gate having one input coupled to each of the signal paths and a counter coupled to the AND gate for counting the coincidence rate of pulses received from the AND gate.

DESCRIPTION OF THE PREFERRED EMBODIMENTS

Figure 1:
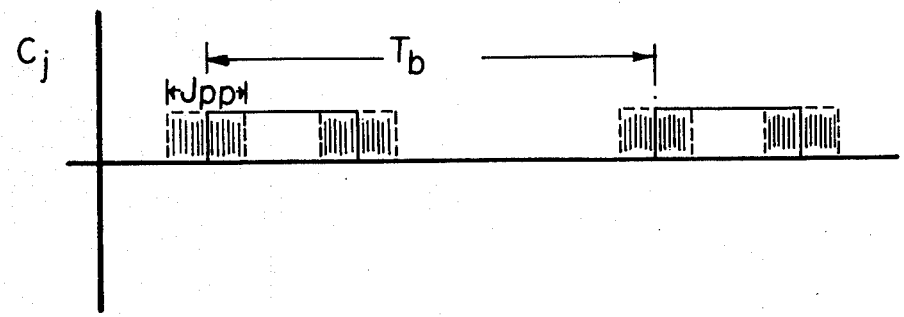
FIG. 1 illustrates a typical jitter clock signal.

FIG. 1 illustrates a typical jitter clock signal $C_j$ recovered from a transmitted data signal received at a receiver or a regeneration repeater. The clock signal $C_j$ has a clock period of $T_b$ and an unknown peak to peak time jitter of $J_{pp}$; the peak to peak jitter being the time span during a period in which the ede of the pulse may actually occur. In most telecommunications systems, a peak to peak jitter $J_{pp}$ of up to 30% of $T_b$ may be tolerated, though less jitter is preferred.

To determine the peak to peak jitter $J_{pp}$ of $C_j$ a second signal having the same jitter probability distribution and peak to peak jitter is required. This can be accomplished by delaying the signal $C_j$ relative to itself. If the delay is great enough, that is to say in the order of 5 periods or greater, the correlation of jitter between the two signals will be negligibly small. The peak to peak jitter is then found by comparing the two signals for coincidence as they are variably delayed with respect to one another within one period.

Figure 2:
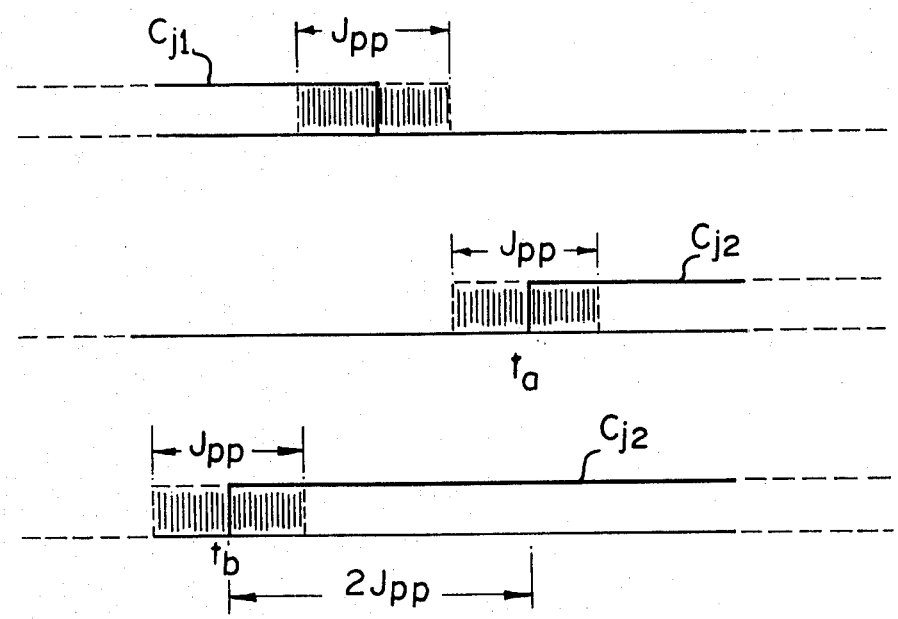
FIG. 2 illustrates coincidence and non coincidence of relatively delayed clock signals.

FIG. 2 illustrates a partial pulse of each of the two signals $C_{j1}$ and $C_{j2}$ which are delayed relative to one another, in addition $C_{j2}$ is shown at two different positions $t_a$ and $t_b$. With $C_{j2}$ at position $t_a$ relative to $C_{j1}$, it is seen that coincidence between $C_{j1}$ and $C_{j2}$ pulses never occurs, however, as $C_{j2}$ is shifted to the left relative to $C_{j1}$, the rate of coincidence increases until such point when $C_{j2}$ is at position $t_b$ relative to $C_{j1}$ where the coincidence rate is equal to the frequency of the signal $C_j$.

Figure 3:
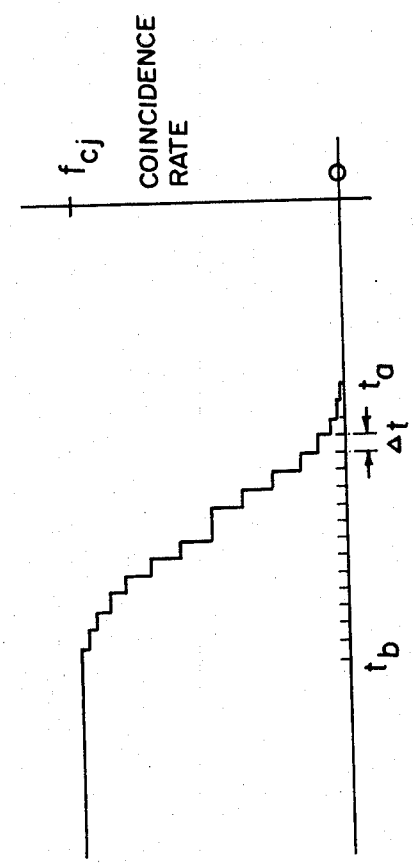
FIG. 3 is a plot of jitter distribution.

FIG. 3 is a plot of the coincidence rate between the pulses in $C_{j1}$ and $C_{j2}$ as $C_{j2}$ is shifted relative to $C_{j1}$ by increments of $\Delta t$. This plot provides the probability distribution of the jitter which occurs over a portion of the period $T_b$. This portion $t_a - t_b$ as seen in FIG. 2 is $2J_{pp}$ or twice the actual peak to peak jitter. Therefore by shifting $C_{j2}$ relative to $C_{j1}$ from a point where no coincidence occurs to the point where maximum coincidence occurs or vice versa, the peak to peak time jitter is determined as $\frac{1}{2}$ of the relative shift. In addition, by taking pulse coincidence rate readings as $C_{j2}$ is being shifted by predetermined increments relative to $C_{j1}$, jitter distribution can be plotted.

In measurement apparatus in accordance with the present invention, the regenerated clock may be split into two paths P₁ and P₂. The shifting of the signals in the two paths P₁ and P₂ relative to one another may then be accomplished by using a single delay line capable of delaying the clock signal by a number of periods with at least the ability of varying the delay within a partial period; or two delay lines, one long fixed line and one short variable line, either both in the same path or each in a different path.

Figure 5:
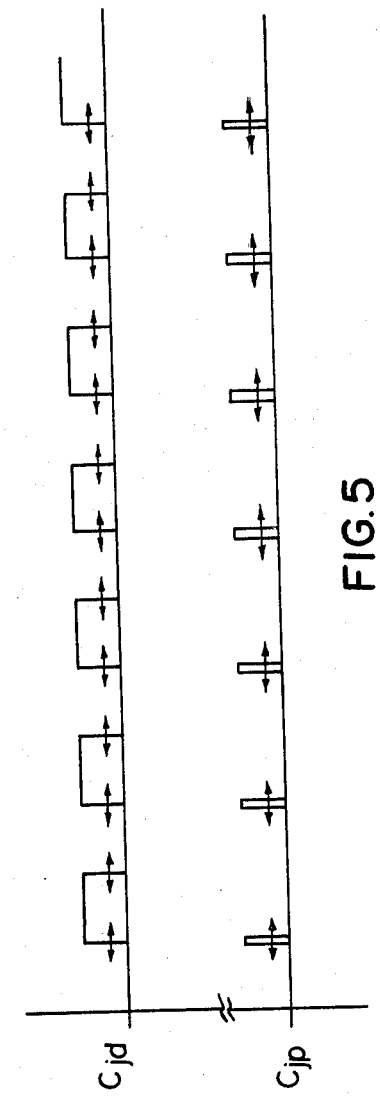
FIG. 5 illustrates the signals in paths $P_1$ and $P_2$ of the apparatus in FIG. 4.
Figure 4:
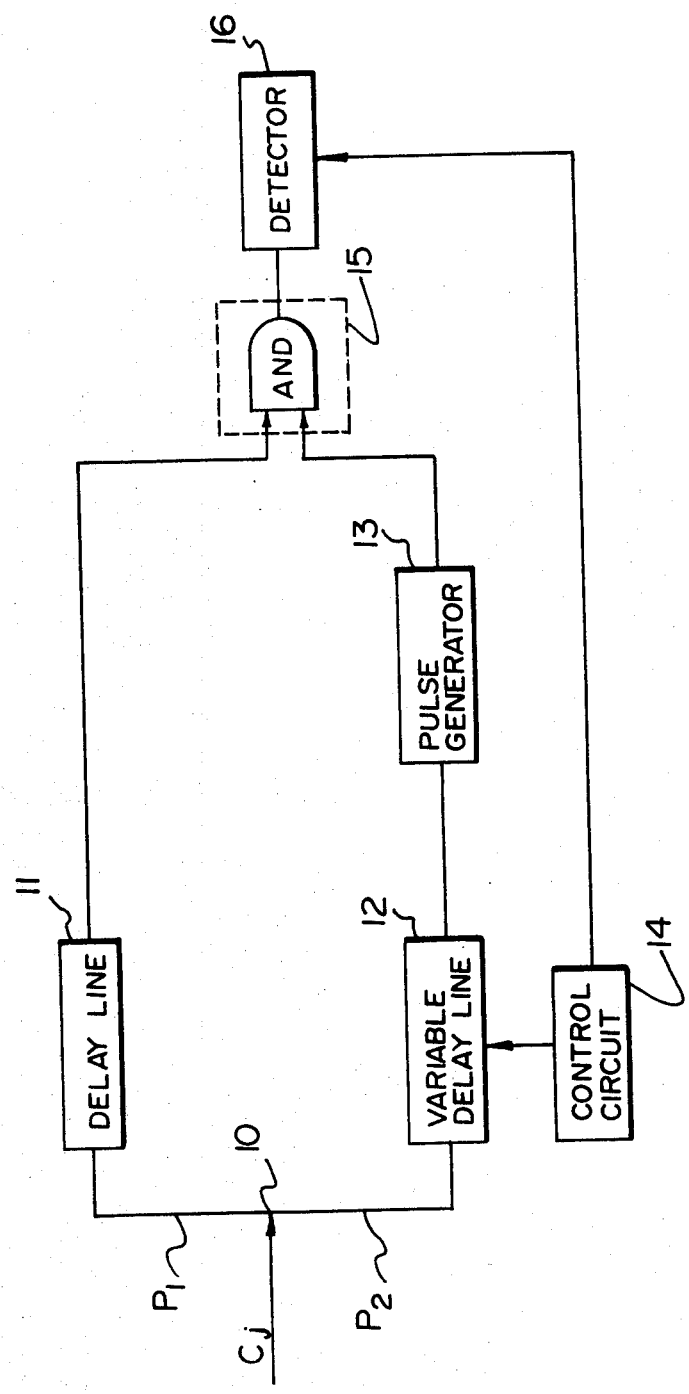
FIG. 4 schematically illustrates jitter apparatus in accordance with the present invention.

In the measurement apparatus, illustrated in FIG. 4, the regenerated clock $C_j$ is split into two paths P₁ and P₂ at a junction 10. In path P₁ the signal $C_j$ is applied to a long fixed delay line 11 having a time delay $T_{dl}=nT_b$. Delay line 11 delays the signal $C_j$ by an amount which is a multiple of the clock period $T_b$ to produce a signal $C_{jd}$ as shown in FIG. 5. $T_{dl}$ need not be an even multiple of $T_b$. For example, the jittery clock signal $C_j$ may have a frequency of 64 kHz. The fixed delay line 11 may be made from conventional components and include a buffer and an asynchronous long delay line made from 120 flip-flops clocked at a frequency of 1.3 MHz. With these parameters, and since $$n = \frac{\text{period of one flip-flop} \times \text{number of flip-flops}}{\text{period of clock signal}}$$

then $$n = \frac{\frac{1}{1.30 \times 10^6} \times 120}{\frac{1}{64 \times 10^3}} = 5.9077$$

and $$T_{dl} = 5.9077\ T_b$$

In path P₂, the signal $C_j$ is applied to a variable delay line 12 to produce a signal having a time delay which is variable over a period of at least $T_b$. This signal is further applied to a pulse generator 13 from which is obtained a narrow output pulse signal $C_{jp}$ as shown in FIG. 5. The width of the pulses in the pulse signal $C_{jp}$ would preferably be less than 0.1 $T_b$. Delay line 12 may be operated manually or it may be controlled by a control circuit 14 so as to operate in one of several modes to be described below. Elements 12 and 13 may be conventional, for instance, delay line 12 may be made from one or more RC network variable delays as described in the publication Electronic Design on page 168 of the Jan. 4, 1979 issue. One of the RC network delays may be set to compensate for any fraction of a period $T_b$ delay in fixed delay line 11, while the other RC network delay may be controlled to step through incremented delay positions.

The delayed signal $C_{jd}$ and the pulse signal $C_{jp}$ are applied to the inputs of a logic circuit 15, such as an AND gate, which provides an output pulse every time it receives coincident pulses from path P₁ and P₂. The AND gate pulses are fed to a detector 16 which may be a simple counter for indicating the pulse rate of the pulses received from the logic circuit 15 for manual operation, or it may also include memory and display apparatus for providing peak to peak jitter as well as jitter probability distribution information under the control of circuit 14.

In one mode of operation, the variable delay line may either manually or automatically, be cyclically swept from a point of 0 coincidence to maximum coincidence as detected by detector 16 to simply indicate peak to peak time jitter. In another mode of operation, the variable delay line 12 may be stepped sequentially through increments of delay such that the detector 16 will provide a pulse rate for each setting or increment resulting in a distribution of the jitter within the jitter time $J_{pp}$. To provide a satisfactory jitter distribution plot, it has been found that the stepped delay increments should be in the order of 0.02 $T_b$. In addition, the delay line 12 should remain at each step for a period long enough to be certain that an accurate pulse rate is obtained, this is particularly true for the steps at the extreme ends of the peak to peak jitter.

The bit rate discussed above is only used by way of example. Since phase-locked loops or bandpass filters are not required in the apparatus in accordance with this invention, the apparatus may be used to measure jitter in a variety of clock signals without alterations to the apparatus.

Modifications in the above described embodiments of the invention can be carried out without departing from the scope thereof and therefore, the scope of the present invention is intended to be limited only by the appended claims.

I claim:

1. Apparatus for determining time jitter of a clock signal of period $T_b$, recovered from a received data signal, comprising:

means for applying the clock signal to first and second signal paths;

signal delay means for delaying the signals in the signal paths relative to one another by a variable delay factor;

logic means coupled to the first and second signal paths for detecting coincidence of the relatively delayed clock signals, and detector means coupled to the logic means for indicating the coincidence rate of the relatively delayed clock signals, as the delay is varied, whereby peak to peak time jitter is half of the relative shift of the delay between the point of minimum coincidence and the point of maximum coincidence.

2. Apparatus as claimed in claim 1 wherein the signal delay means includes:

fixed delay means having a fixed delay factor positioned in one of the signal paths; and variable delay means having a variable delay factor positioned in one of the signal paths.

3. Apparatus as claimed in claim 2 wherein the fixed delay means is located in the first signal path and the variable delay means is located in the second signal path.

4. Apparatus as claimed in claim 2 or 3 wherein the fixed delay factor is $nT_b$ where n is equal to or greater than 5.

5. Apparatus as claimed in claim 2 or 3 wherein the variable delay means delay factor varies over a period greater than $2J_{pp}$ where $J_{pp}$ is the peak to peak time jitter of the recovered clock signal.

6. Apparatus as claimed in claim 3 wherein the second signal path further includes a pulse generating means for generating a signal consisting of a train of narrow pulses from the recovered clock signal.

7. Apparatus as claimed in claim 1 which further includes control means coupled to the signal delay means to increment the relative delay between the signal in the signal paths over the variable delay factor, in a predetermined sequence.

8. Apparatus for determining time jitter of a clock signal of period $T_b$, recovered from a received data signal, comprising:
- means for applying the clock signal to first and second signal paths;
- signal delay means for delaying the signals in the signal paths relative to one another by a variable delay factor;
- AND gate means having one input coupled to the signal in the first signal path and one input coupled to the signal in the second signal path; and
- counter means coupled to the AND gate means for counting the coincidence rate of pulses received from the AND gate, as the delay is varied.

9. Apparatus as claimed in claim 8 wherein the signal delay means includes:
- fixed delay means having a fixed delay factor positioned to one of the signal paths; and
- variable delay means having a variable delay factor positioned in one of the signal paths.

10. Apparatus as claimed in claim 9 wherein the fixed delay means is located in the first signal path and the variable delay means is located in the second signal path.

11. Apparatus as claimed in claim 9 or 10 wherein the fixed delay factor is $nT_b$ where n is equal to or greater than 5.

12. Apparatus as claimed in claim 9 or 10 wherein the variable delay means delay factor varies over a period greater then $2J_{pp}$ where $J_{pp}$ is the peak to peak time jitter of the recovered clock signal.

13. Apparatus as claimed in claim 10 wherein the second signal path further includes a pulse generating means for generating a signal consisting of a train of narrow pulses from the recovered clock signal.

14. Apparatus as claimed in claim 8 which further includes control means coupled to the signal delay means to increment the relative delay between the signal in the signal paths over the variable delay factor, in a predetermined sequence.

* * * * *